(12) United States Patent
Chueh et al.

(10) Patent No.: US 8,815,633 B1
(45) Date of Patent: Aug. 26, 2014

(54) METHOD OF FABRICATING 3D STRUCTURE ON CIGS MATERIAL

(71) Applicant: National Tsing Hua University, Hsinchu (TW)

(72) Inventors: Yu-Lun Chueh, Hsinchu (TW); Hsiang-Ying Cheng, Hsinchu (TW); Yi-Chung Wang, Hsinchu (TW); Yu-Ting Yen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/910,516

(22) Filed: Jun. 5, 2013

(30) Foreign Application Priority Data

Apr. 18, 2013 (TW) .............................. 102113741 U

(51) Int. Cl.
*H01L 21/00* (2006.01)
*H01L 31/18* (2006.01)

(52) U.S. Cl.
CPC ...................................... *H01L 31/18* (2013.01)
USPC ......... 438/95; 438/93; 438/745; 257/E21.001

(58) Field of Classification Search
USPC ......................................................... 438/95
See application file for complete search history.

(56) References Cited

U.S. PATENT DOCUMENTS

| 8,563,351 B2 * | 10/2013 | Tu et al. ........................ 438/68 |
| 2008/0119005 A1 * | 5/2008 | Weidman et al. ............... 438/95 |
| 2010/0233841 A1 | 9/2010 | Platzer Bjorkman et al. |
| 2011/0111599 A1 * | 5/2011 | Lennon et al. ................ 438/703 |
| 2012/0196444 A1 * | 8/2012 | Lennon et al. ................ 438/703 |

* cited by examiner

*Primary Examiner* — Angel Roman
(74) *Attorney, Agent, or Firm* — Muncy, Geissler, Olds & Lowe, P.C.

(57) ABSTRACT

A method of fabricating a 3-dimensional structure on a copper-indium-gallium-diselenide material comprises steps: preparing a CIGS (Copper Indium Gallium Diselenide) substrate, and defining two types of regions complementary to each other on the CIGS substrate; providing a mold absorbing an etching solution that can etch the CIGS substrate instead of the mold; aligning the mold to the two types of regions, and allowing the etching solution to flow out from the mold and contact with the two types of regions to etch the two types of regions for generating a level drop between the two types of regions and forming a 3-dimensional (3D) structure on the CIGS substrate. As a result, the present invention can fabricate a large-area 3D structure on a CIGS substrate rapidly without using expensive equipments or complicated processes.

10 Claims, 16 Drawing Sheets

METHOD OF FABRICATING 3D STRUCTURE ON CIGS MATERIAL

FIELD OF THE INVENTION

The present invention is related to a CIGS-based material, and particularly to a method of fabricating 3D structures on CIGS thin films.

BACKGROUND OF THE INVENTION

The CIGS (Copper Indium Gallium Diselenide) thin-film solar cell, owing to its high energy conversion efficiency, high absorption coefficient, and lower cost than the crystalline silicon solar cells, is regarded as a promising competitor among the next-generation photovoltaics.

US publication No. US 2010/0233841 disclosed a CIGS-based solar cell characterized in comprising a first buffer layer formed on the CIGS layer and made of Zn(O, S) and a second buffer layer formed on the first buffer layer and made of ZnO. Both buffer layers are deposited in the same ALD (Atom Layer Deposition) process. The prior art can simplify the process for fabricating thin-film solar cells and reduce the cost thereof.

The microstructures fabricated on thin-film solar cells can reduce reflection of incident light, increase light absorption and therefore improve efficiency of the solar cell. Moreover, the thin-film solar cells with microstructures are able to be fabricated on flexible substrates via roll to roll method of continuous manufacturing to further reduce costs.

However, the current methods for fabricating microstructures, including the photolithography, the RIE (Reactive Ion Etching), the laser etching, and the FIB (Focused Ion Beam), are either expensive or complicated. Therefore, a method able to fabricate microstructures on a CIGS material in a simple way should be a breakthrough contribution to the related industries.

SUMMARY OF THE INVENTION

The primary objective of the present invention is to solve the problem of high cost and high fabrication difficulty caused by that the conventional technology needs expensive equipment and complicated processes to fabricate microstructures on a thin film.

To achieve the above mentioned objective, the present invention proposes a method of fabricating a 3-dimensional (3D) structure on a copper-indium-gallium-diselenide (CIGS) material, which comprises the following steps:

Step 1: preparing a CIGS substrate, and defining the first preserved regions and the first etched regions complementary to the first preserved regions on the CIGS substrate;

Step 2: providing a mold with a surface and a shape-forming structure on the surface;

Step 3: allowing the mold together with the shape-forming structure to absorb an etching solution that can etch the CIGS substrate instead of the mold; and Step 4: aligning the shape-forming structure of the mold to the first etched regions, and allowing the etching solution to contact and etch the first etched regions, whereby to form a first 3D structure on the CIGS substrate.

The present invention also proposes another method of fabricating a 3D structure on a CIGS material, which comprises the following steps:

Step A: preparing a CIGS substrate, and defining the primary etched regions and the secondary etched regions complementary to the primary etched regions on the CIGS substrate;

Step B: providing a mold which absorbs an etching solution and includes the primary release regions and the secondary release regions in which the etching solution is released slower than that in the primary release regions, wherein the etching solution can etch the CIGS substrate instead of the mold;

Step C: aligning the primary release regions to the primary etched regions and aligning the secondary release regions to the secondary etched regions, and allowing the etching solution to be released out from the mold to contact with the primary etched regions and the secondary etched regions to form the first recesses on the primary etched regions and the second recesses on the secondary etched regions, wherein the first recesses are deeper than the second recesses, whereby a 3D structure on the CIGS structure is formed.

In the present invention, the mold absorbs the etching solution and then releases the etching solution to contact with the CIGS substrate. Thereby, the present invention can use a wet etching method to fabricate a large-area and uniform 3D structures without using expensive equipments or complicated processes. Therefore, the present invention has advantages of low cost and mass production.

DETAILED DESCRIPTION OF THE PREFERRED EMBODIMENTS

The technical contents of the present invention are described in detail in cooperation with the drawings below.

Figure 1:
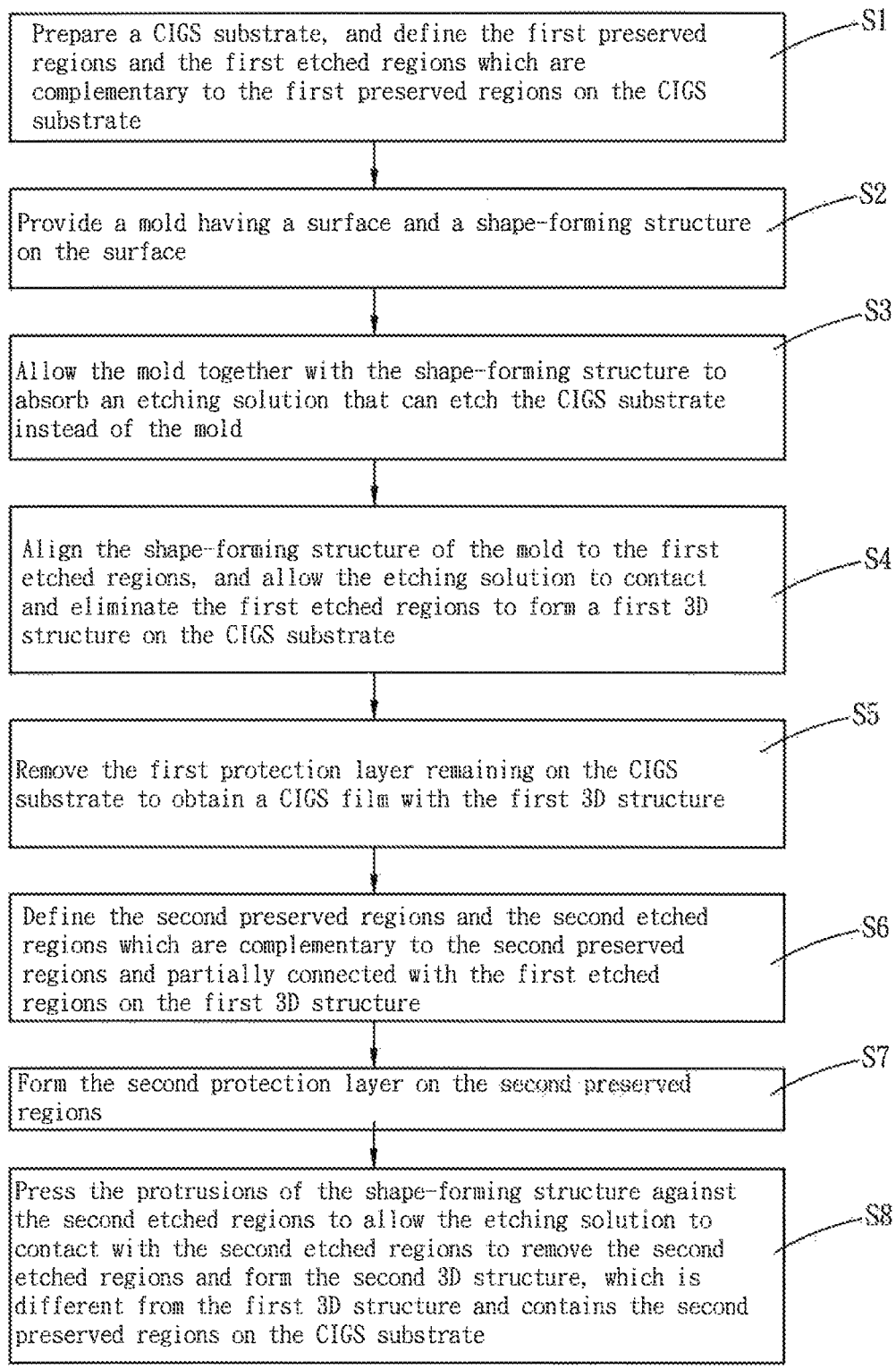
FIG. 1 is a flowchart of a method according to a first embodiment of the present invention.

Refer to FIG. 1 and FIGS. 2A-2J. FIG. 1 is a flowchart of a method according to a first embodiment of the present invention. FIGS. 2A-2J are diagrams schematically showing the steps of a method according to the first embodiment of the present invention. In the first embodiment, the present invention proposes a method of fabricating a 3D structure on a CIGS material, which comprises Steps 1-8.

Figure 2A:
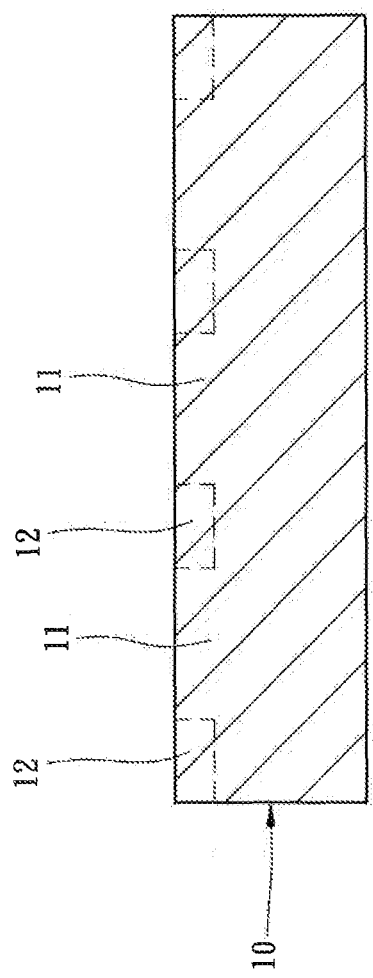
FIGS. 2A-2J are diagrams schematically showing the steps of a method according to the first embodiment of the present invention.

Step 1 (S1): Prepare a CIGS substrate 10, and define the first preserved regions 11 and the first etched regions 12 complementary to the first preserved regions 11 on the CIGS substrate 10, as shown in FIG. 2A. In the first embodiment, the CIGS substrate 10 is a CIGS thin film but not limited to be an absorption layer of a solar cell.

Figure 2B:
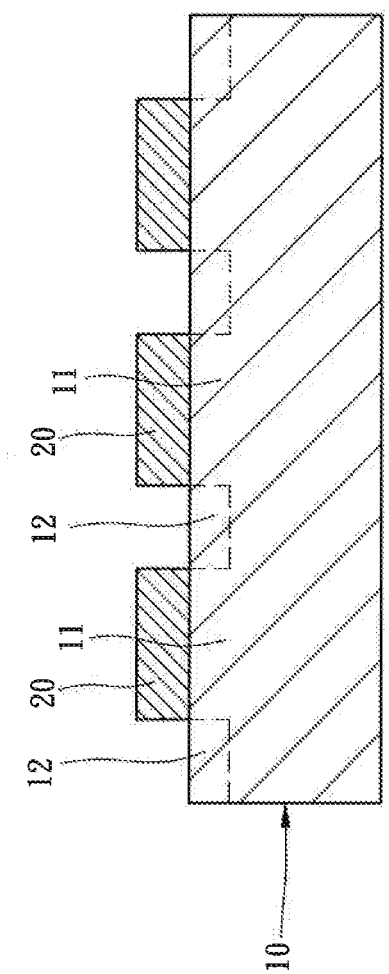

As shown in FIG. 2B, the first embodiment further comprises Step 1a.

Figure 2C:
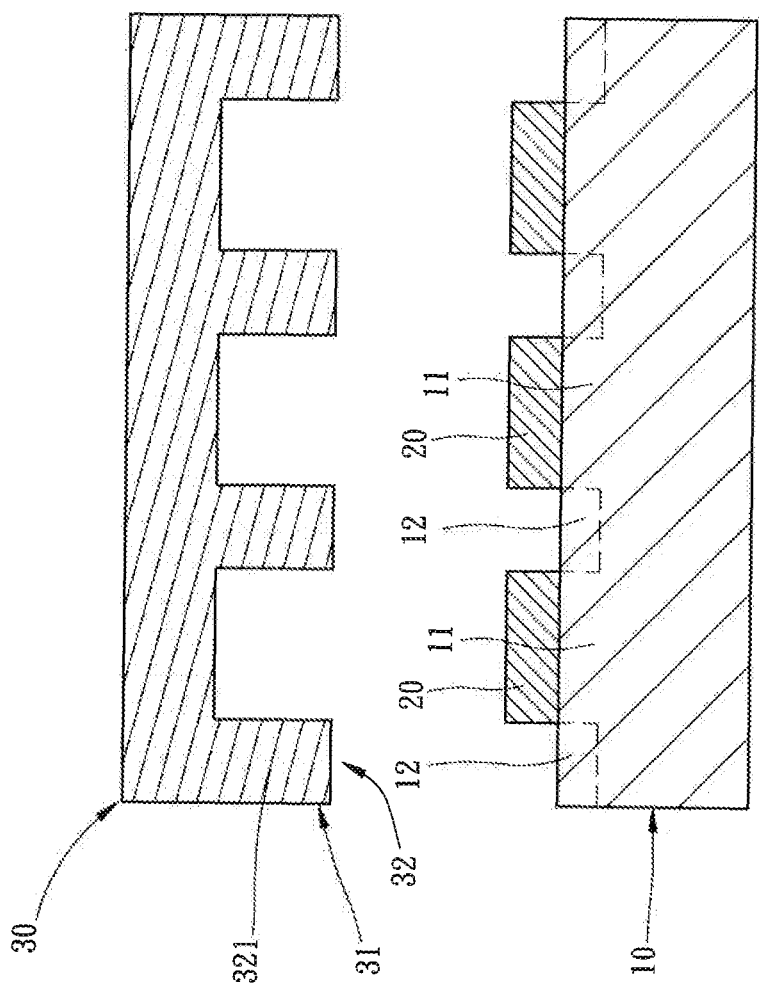

Step 1a: Form a first protection layer 20 over the first preserved regions 11. In one embodiment, the first protection layer 20 is composed by an organic solvent, as shown in FIG. 2C. For example, the first protection layer 20 is composed by mineral oil and a surfactant. The organic solvent is dripped onto the first preserved regions 11 by a pipette to form the first protection layer 20.

Alternatively, a spin-coater is used to spread the first protection layer 20 on the first preserved regions 11.

Step 2 (S2): Provide a mold 30 having a surface 31 and a shape-forming structure 32 on the surface 31, as shown in FIG. 2C. The mold 30 is made of a soft material, such as agarose, and has elasticity. In the first embodiment, the shape-forming structure 32 has a plurality of protrusions 321 extending toward the CIGS substrate 10.

Figure 2D:
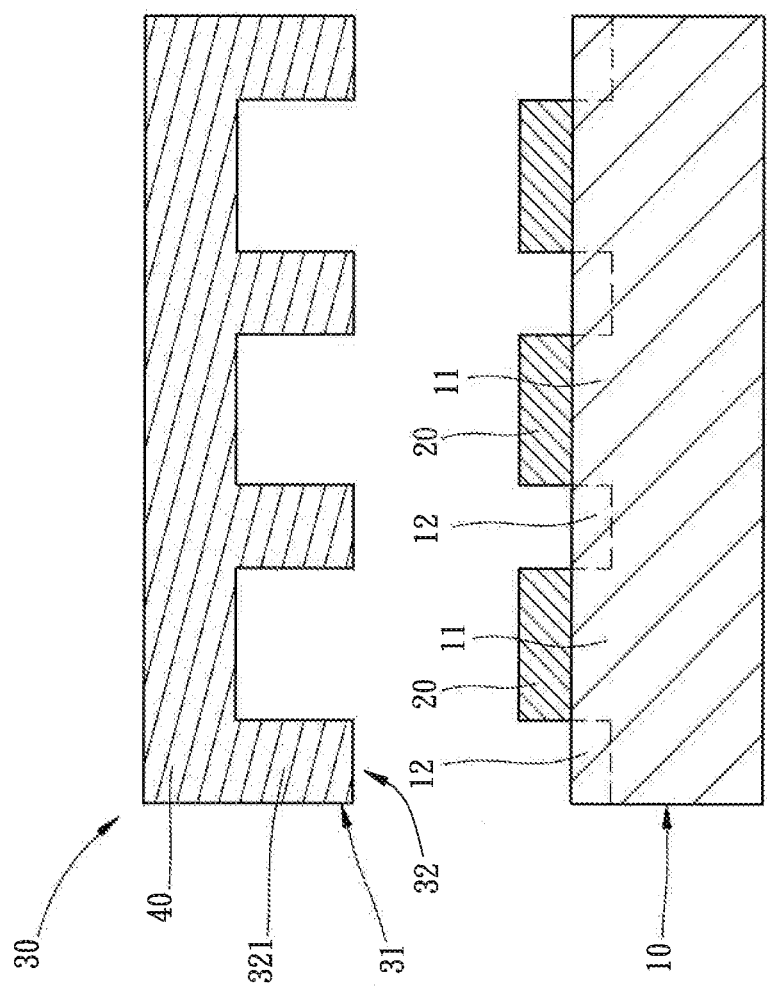

Step 3 (S3): Let the mold 30 together with the shape-forming structure 32 absorb an etching solution 40 with the protrusions 321, as shown in FIG. 2D. The etching solution 40 can etch the CIGS substrate 10 selectively but would not etch the mold 30 or the first protection layer 20. In one embodiment, the etching solution 40 is methanol solution with bromine additives.

Figure 2E:
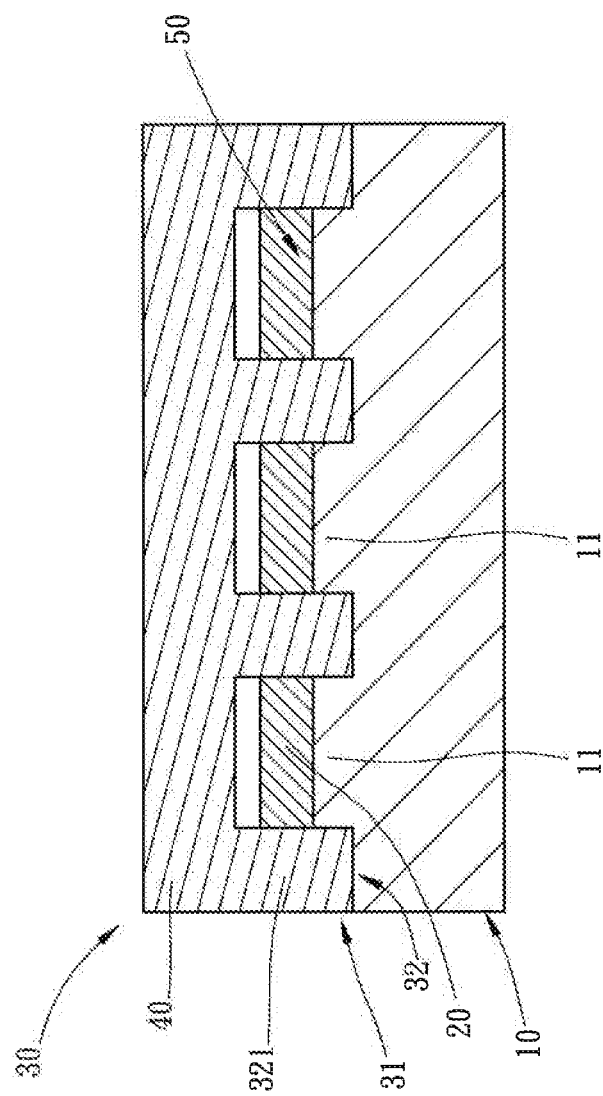
Figure 2F:
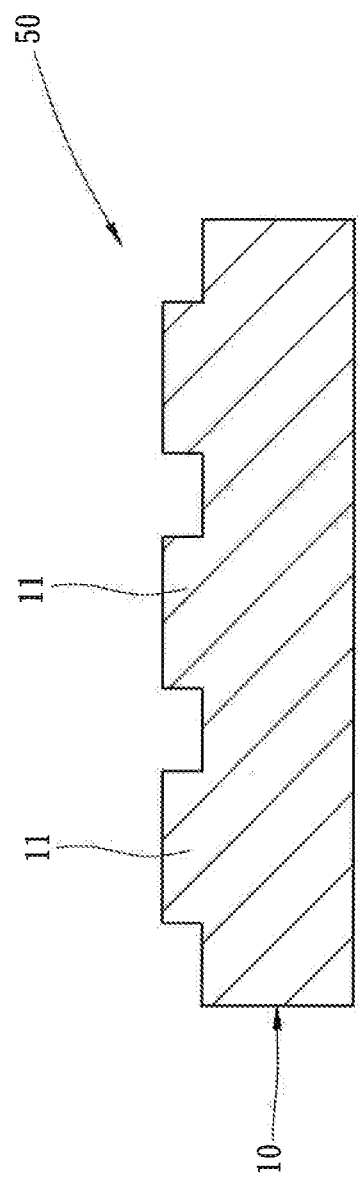

Step 4 (S4): Align the shape-forming structure 32 of the mold 30 to the first etched regions 12, and press the protrusions 321 of the shape-forming structure 32 against the first etched regions 12 to let the etching solution 40 contact the first etched regions 12 compliantly via the flexibility of the protrusions 321 and remove the first etched regions 12, which are not shielded by the first protection layer 20. Thereby, the first preserved regions 11 are preserved and relatively protrude from the CIGS substrate 10 to form a first 3D structure 50 on the CIGS substrate 10, as shown in FIG. 2E.

Besides, the first embodiment further comprises Step 5 (S5) succeeding to Step 4 (S4).

Step 5 (S5): Use a readily available organic solvent, such as acetone, to remove the first protection layer 20 remaining on the CIGS substrate 10, as shown in FIG. 2E. Thereby, the CIGS substrate 10 turns into a CIGS film with the first 3D structure 50.

Additionally, the first embodiment may further comprise the following steps succeeding to Step S5.

Figure 2G:
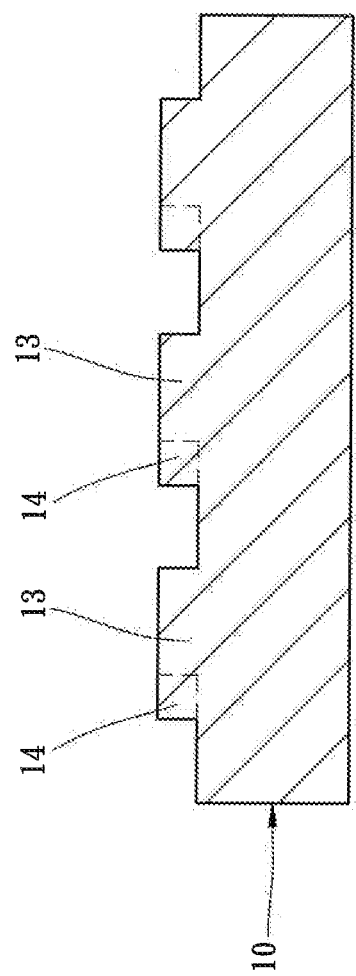

Step 6 (S6): Define the second preserved regions 13 and the second etched regions 14 on the first 3D structure 50. The second etched regions 14 are complementary to the second preserved regions 13 and connected with the first etched regions 12 partially, as shown in FIG. 2G.

Figure 2H:
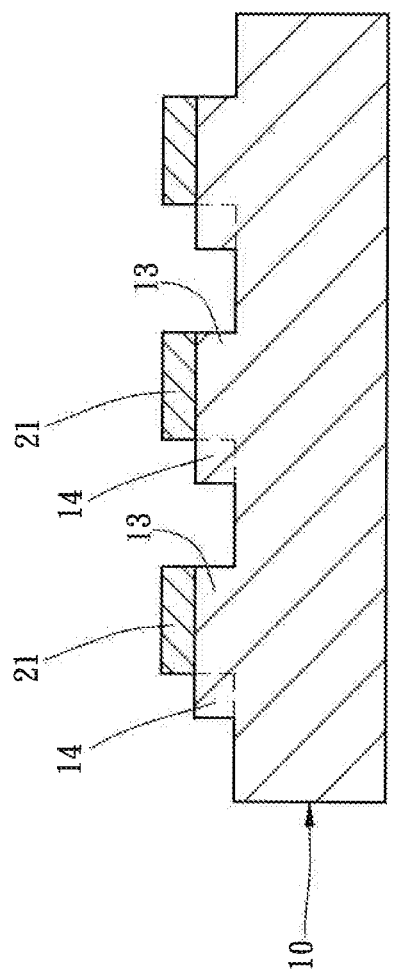

Step 7 (S7): Form a second protection layer 21 on the second preserved regions 13, as shown in FIG. 2H.

Figure 2I:
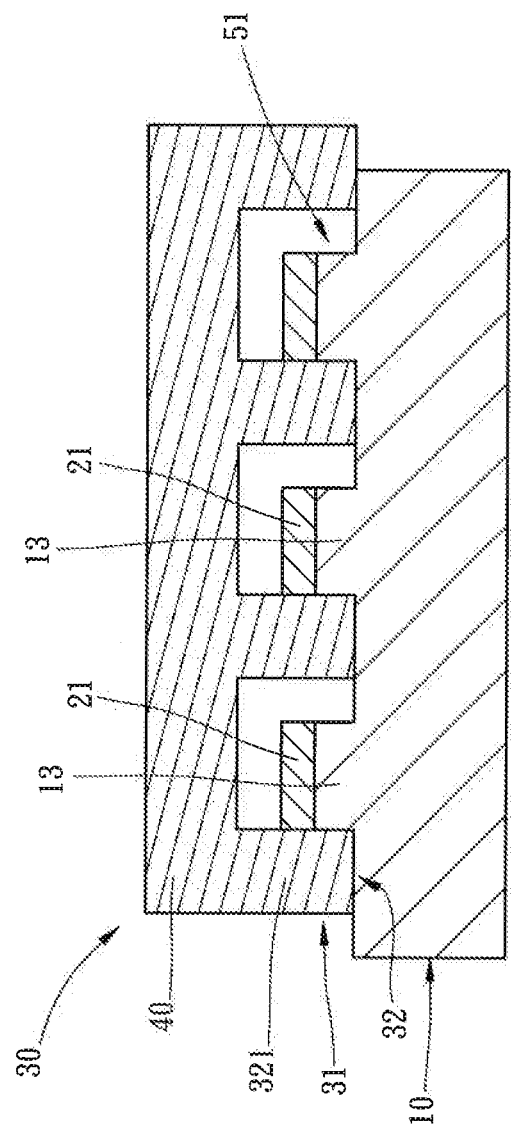
Figure 2J:
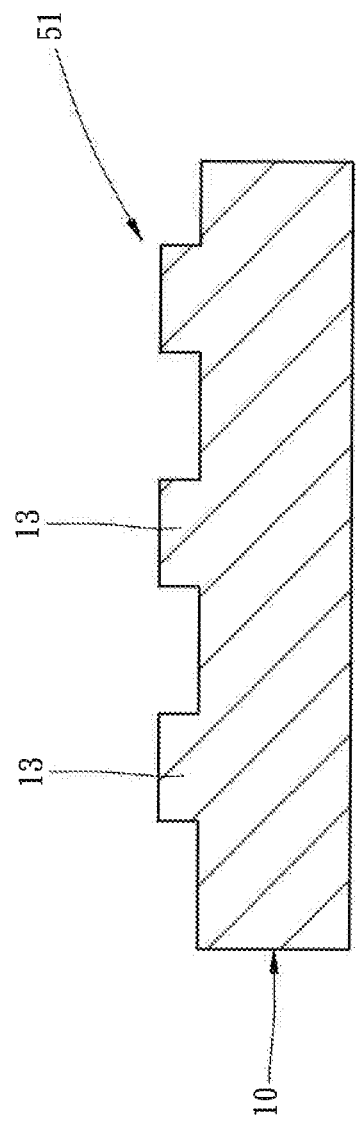

Step 8 (S8): Press the protrusions 321 of the shape-forming structure 32 against the second etched regions 14, and let the etching solution 40 contact with the second etched regions 14 to remove the second etched regions 14, as shown in FIG. 2I. Then, remove the remaining second protection layer 21, as shown in FIG. 2J. Thus, the second etching process fabricates a second 3D structure 51, which is different from the first 3D structure 50 and contains the second preserved regions 13.

Figure 3:
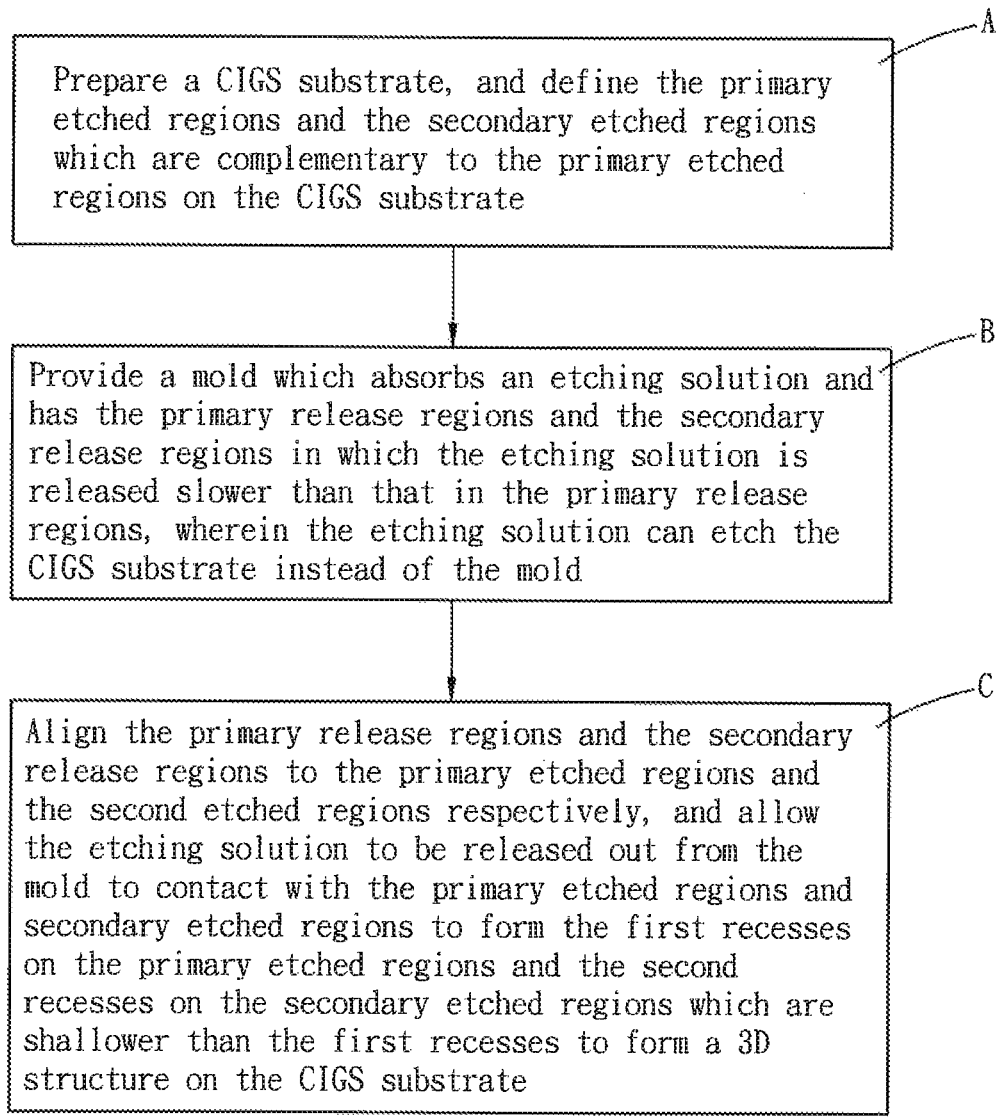
FIG. 3 is a flowchart of a method according to a second embodiment of the present invention.

Refer to FIG. 3 and FIGS. 4A-4D. FIG. 3 is a flow chart of a method according to a second embodiment of the present invention. FIGS. 4A-4D are diagrams schematically showing the steps of a method according to the second embodiment of the present invention. In the second embodiment, the present invention further proposes another method of fabricating a 3D structure on a CIGS material, which comprises Steps A-C.

Figure 4A:
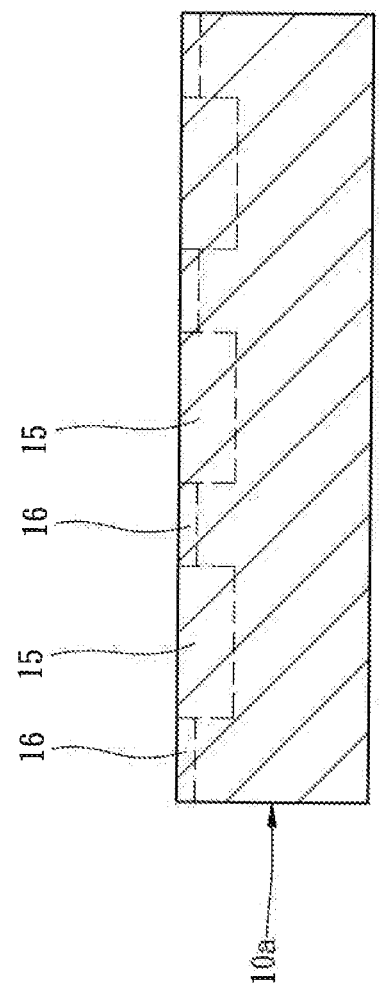
FIGS. 4A-4D are diagrams schematically showing the steps of a method according to the second embodiment of the present invention.

Step A: Prepare a CIGS substrate 10a, and define the primary etched regions 15 and the secondary etched regions 16 complementary to the primary etched regions 15 on the CIGS substrate 10a, as shown in FIG. 4A.

Figure 4B:
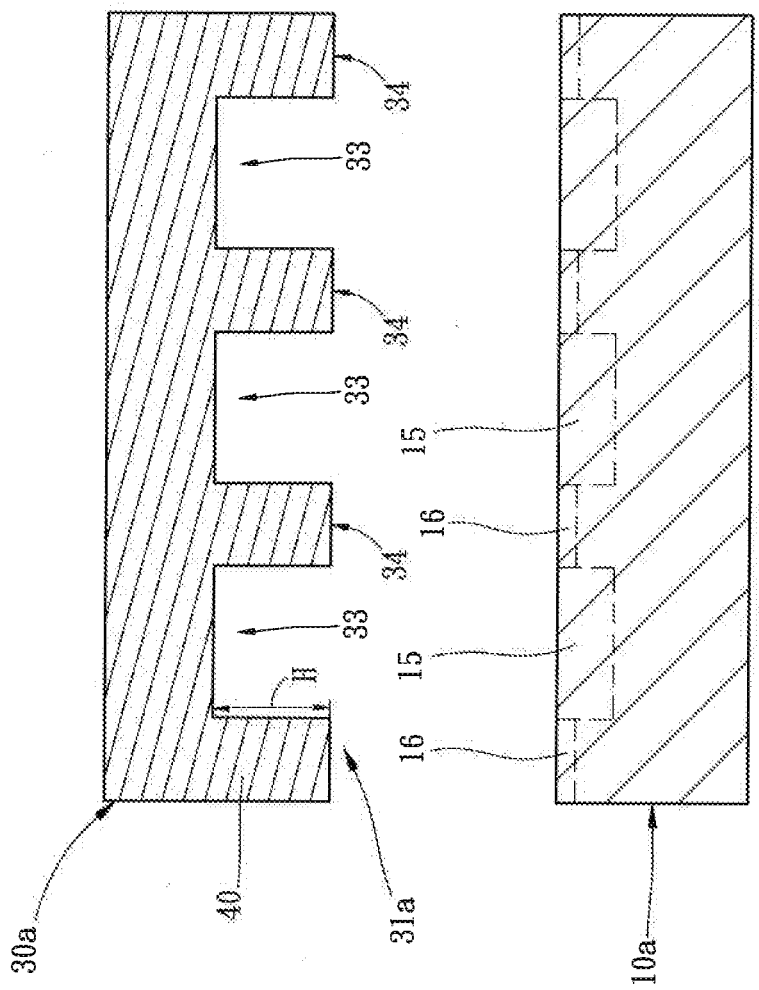

Step B: Provide a mold 30a which absorbs an etching solution 40 and includes primary release regions 33 and secondary release regions 34 in which the etching solution 40 is released slower than that in the primary release regions 33, as shown in FIG. 4B. The etching solution 40 can etch the CIGS substrate 10a instead of the mold 30a. In the second embodiment, the mold 30a and the etching solution 40 are respectively made of the same materials used in the first embodiment. On a surface 31a of the mold 30a, a level drop H exists between the primary release regions 33 and the secondary release regions 34.

Figure 4C:
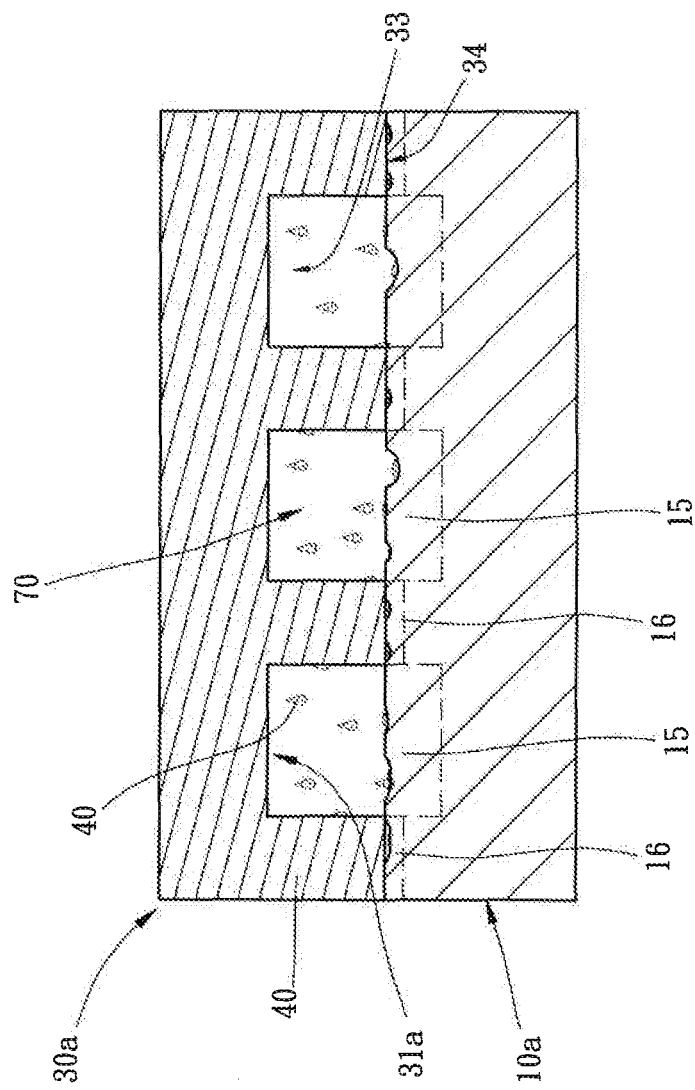
Figure 4D:
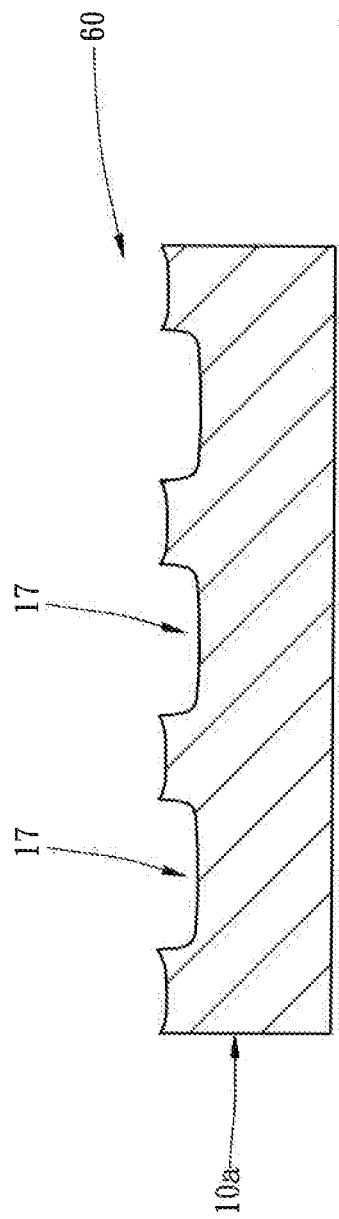

Step C: Align the primary release regions 33 and the secondary release regions 34 to the primary etched regions 15 and the secondary etched regions 16 respectively, as shown in FIG. 4C. Owing to the level drop H, the secondary release regions 34 contact with the secondary etched regions 16, but the primary release regions 33 do not contact with the primary etched regions 15 to form spaces 70 with the primary etched regions 15. Owing to the spaces 70, the primary release regions 33 have greater release areas than the secondary release regions 34. Therefore, the releasing rate of the etching solution 40 in the primary etched regions 15 is greater than that in the secondary etched regions 16. Thus, the etching process will generate first recesses 17 on the primary etched regions 15 and second recesses on the secondary etched regions 16, and the first recesses 17 are deeper than the second recesses, as shown in FIG. 4D. Thereby a 3D structure 60 on the CIGS substrate 10a is formed.

In conclusion, the present invention uses a relatively simple mold-assisted chemical etching method via a mold to absorb an etching solution and contact with a CIGS substrate to fast fabricate large-area and uniform 3D structures on the CIGS substrate, which has the potential for low-cost and large-area production. Further, the present invention uses the primary release regions and the secondary release regions of the same mold, which respectively release the etching solution at different rates, to form different 3D structures on the CIGS thin film. Furthermore, the present invention can use multiple etching processes to modify the topography of the original 3D structures.

What is claimed is:

1. A method of fabricating a 3-dimensional structure on a copper-indium-gallium-diselenide material, comprising steps of:
    Step 1: preparing a CIGS (Copper Indium Gallium Diselenide) substrate, and defining first preserved regions and first etched regions which are complementary to the first preserved regions on the CIGS substrate;
    Step 2: providing a mold with a surface and a shape-forming structure on the surface;
    Step 3: allowing the mold which has the shape-forming structure to absorb an etching solution that etches the CIGS substrate instead of the mold; and
    Step 4: aligning the shape-forming structure from the mold to the first etched regions, and letting the etching solution contact with the first etched regions to eliminate the first etched regions and form a first 3-dimensional (3D) structure on the CIGS substrate.

2. The method of fabricating a 3-dimensional structure on a copper-indium-gallium-diselenide material according to claim 1 further comprising Step 1a: forming a first protection layer which is resistant to the etching solution on the first preserved regions, and further comprising Step 5: removing the first protection layer which remains on the CIGS substrate to form the first 3D structure; wherein the Step 1a succeeds to the Step 1 and the Step 5 succeeds to the Step 4; and wherein in the Step 2, the shape-forming structure has plurality of protrusions; and wherein in the Step 4, the protrusions are aligned and pressed onto the first etched regions to allow the etching solution to contact with the first etched regions to form the first 3D structure with the first preserved regions including the protrusions.

3. The method of fabricating a 3-dimensional structure on a copper-indium-gallium-diselenide material according to claim 2 further comprising the steps of:
    Step 6: defining second preserved regions and second etched regions which are complementary to the second preserved regions and partially connected with the first etched regions on the first 3D structure;

Step 7: forming a second protection layer on the second preserved regions; and

Step 8: pressing the protrusions of the shape-forming structure against the second etched regions to allow the etching solution to contact with the second etched regions to eliminate the second etched regions to form a second 3D structure on the CIGS substrate which is different from the first 3D structure and contains the second preserved regions.

4. The method of fabricating a 3-dimensional structure on a copper-indium-gallium-diselenide material according to claim 2, wherein in the Step 1a, the first protection layer is composed by organic solvent, and the organic solvent contains mineral oil and a surfactant.

5. The method of fabricating a 3-dimensional structure on a copper-indium-gallium-diselenide material according to claim 1, wherein in the Step 2, the mold is made of agarose.

6. The method of fabricating a 3-dimensional structure on a copper-indium-gallium-diselenide material according to claim 1, wherein in the Step 2, the mold is flexible.

7. The method of fabricating a 3-dimensional structure on a copper-indium-gallium-diselenide material according to claim 1, wherein in the Step 3, the etching solution is composed by methanol solution with bromine additives.

8. A method of fabricating a 3-dimensional structure on a copper-indium-gallium-diselenide material, comprising steps of:

Step A: preparing a CIGS (Copper Indium Gallium Diselenide) substrate, and defining primary etched regions and secondary etched regions which are complementary to the primary etched regions on the CIGS substrate;

Step B: providing a mold which absorbs an etching solution and includes primary release regions and secondary release regions in which the etching solution is released slower than that in the primary release regions; wherein the etching solution etches the CIGS substrate instead of the mold; and Step C: aligning the primary release regions and the secondary release regions to the primary etched regions and the secondary etched regions respectively, and allowing the etching solution to be released out from the mold to contact with the primary etched regions and the secondary etched regions to form first recesses on the primary etched regions and second recesses on the secondary etched region which are shallower than the first recesses to form a 3D structure on the CIGS substrate.

9. The method of fabricating a 3-dimensional structure on a copper-indium-gallium-diselenide material according to claim 8, wherein a level drop exists between the primary release regions and the secondary release regions, and wherein in the Step C, the secondary release regions contact with the secondary etched regions, while the primary release regions do not contact with the primary etched regions.

10. The method of fabricating a 3-dimensional structure on a copper-indium-gallium-diselenide material according to claim 8, wherein in the Step C, the releasing rate of the etching solution in the primary etched regions is greater than that in the secondary etched regions.

* * * * *